(12) United States Patent
Files et al.

(10) Patent No.: US 11,825,678 B2
(45) Date of Patent: Nov. 21, 2023

(54) INFORMATION HANDLING SYSTEM TRANSPARENT OLED DISPLAY AND METHOD OF CONTROL THEREOF

(71) Applicant: Dell Products L.P., Round Rock, TX (US)

(72) Inventors: Jace W. Files, Round Rock, TX (US); John Trevor Morrison, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 178 days.

(21) Appl. No.: 17/081,266

(22) Filed: Oct. 27, 2020

(65) Prior Publication Data

US 2022/0131105 A1   Apr. 28, 2022

(51) Int. Cl.
*G06F 1/16*  (2006.01)
*H10K 50/828*  (2023.01)
*H10K 102/00*  (2023.01)

(52) U.S. Cl.
CPC ......... *H10K 50/828* (2023.02); *G06F 1/1649* (2013.01); *G06F 1/1662* (2013.01); *H10K 2102/3031* (2023.02)

(58) Field of Classification Search
CPC ......... H01L 51/5234; H01L 2251/5323; G06F 1/1649; G06F 1/1662
See application file for complete search history.

(56) References Cited

U.S. PATENT DOCUMENTS

| | | | |
|---|---|---|---|
| 7,965,272 B2 | 6/2011 | Eom | |
| 8,362,992 B2 | 1/2013 | Kuhlman et al. | |
| 9,153,165 B2 | 10/2015 | Zhang et al. | |
| 9,177,502 B2 | 11/2015 | Jang et al. | |
| 9,245,934 B2 | 1/2016 | Chung et al. | |
| 9,563,229 B2 * | 2/2017 | Behar | G06F 1/1637 |
| 9,605,984 B2 | 3/2017 | Farell | |
| 10,789,885 B1 * | 9/2020 | Hrehor, Jr. | G09G 3/3225 |
| 2011/0084893 A1 * | 4/2011 | Lee | G06F 3/016 345/6 |
| 2016/0259370 A1 * | 9/2016 | Ho | G06F 1/1679 |
| 2018/0188774 A1 * | 7/2018 | Ent | G06F 1/1616 |
| 2018/0217429 A1 | 8/2018 | Busch | |
| 2020/0335036 A1 * | 10/2020 | Hrehor, Jr. | G09G 3/2003 |

FOREIGN PATENT DOCUMENTS

WO    WO-2014110567 A2 *   7/2014   ..........   G06F 1/1616

* cited by examiner

*Primary Examiner* — Afroza Chowdhury
(74) *Attorney, Agent, or Firm* — ZAGORIN CAVE LLP; Robert W. Holland

(57) ABSTRACT

A portable information handling system presents visual images in a tablet configuration having a housing in a closed position by passing the visual images through a switchable film having a transparent state and out an upper surface of housing. The housing opens to a clamshell configuration to expose the display at the inner housing surface and presents display visual images against an opaque state of the switchable film. A graphics processor or timing controller adjusts the visual image orientation based upon whether the display is viewed from the inner surface or outer surface.

19 Claims, 7 Drawing Sheets

INFORMATION HANDLING SYSTEM TRANSPARENT OLED DISPLAY AND METHOD OF CONTROL THEREOF

BACKGROUND OF THE INVENTION

Field of the Invention

The present invention relates in general to the field of portable information handling systems, and more particularly to an information handling system transparent OLED display and method of control thereof.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. In a tablet configuration, the lid housing portion rotates approximately 360 degrees to expose the display while the keyboard is placed under the housing and out of the way. As an alternative, some convertible information handling systems replace the keyboard with a second display so that a larger tablet viewing area is available when the housing rotates 180 degrees. After usage, convertible information handling systems rotate the lid housing portion over the main housing portion to protect the keyboard and display, thus reducing the system footprint for improved storage and mobility.

An advantage of a tablet configuration is that an end user has a viewing area for the display that provides for viewing of visual information without having the keyboard in the way, which makes handling of the system less awkward. Nonetheless, end users tend to want a physical keyboard integrated with the system that provides convenient keyed inputs when creating content, such as word processing or writing emails. Although a dual display system offers a larger display area in the tablet mode, the lack of an integrated keyboard tends to discourage wide spread adoption by those end users who need to type inputs while mobile. A separate keyboard is often available for typing inputs but often viewed as inconvenient by the end user. On the other hand, end users tend to avoid use of a tablet mode that rotates the keyboard 360 degrees to the rear of the system since the keyboard at the bottom of the system tends to feel unnatural and provides an odd base to the end user for supporting the system housing against a support surface. Generally, end users who have systems that support a tablet mode often choose not to use the tablet mode because the conversion to the tablet mode tends to be too unnatural and inconvenient.

SUMMARY OF THE INVENTION

Therefore, a need has arisen for a system and method which provides a tablet mode at an information handling system having an integrated keyboard.

In accordance with the present invention, a system and method are provided which substantially reduce the disadvantages and problems associated with previous methods and systems for providing a tablet mode at an information handling system. A portable information handling system selectively presents visual images in a tablet mode at an outer surface of a closed lid housing portion by transitioning a switchable film disposed between a display film and the lid housing portion opaque and transparent.

More specifically, a portable information handling system processes information with processing components disposed in a portable housing, such as central processing unit and memory that execute an operating system and applications to generate visual images for presentation at a display. The housing has a main housing portion coupled to a lid housing portion by a hinge. Processing components and a keyboard couple to the main housing portion and a display couples to the lid housing portion with a switchable film disposed between the display and lid housing portion. In a clamshell configuration, the lid housing portion rotates approximately 90 degrees relative to the main housing portion to raise the display to a viewing position over the keyboard. A switching film disposed behind the display switches to an opaque state in the clamshell configuration so that the display is visible at the inner surface of the lid housing portion and not visible at the outer surface. In a closed tablet configuration with the lid housing portion closed over the main housing portion to place the display in proximity to the keyboard, the switchable film transitions to a transparent state so that visual images presented by the display are visible through a transparent material of the lid housing portion. Touch detection integrated in the lid housing portion outer surface, such as capacitive touch sensors, accept inputs to visual images presented at the lid housing portion outer surface in the tablet configuration.

The present invention provides a number of important technical advantages. One example of an important technical advantage is that a portable information handling system provides a tablet configuration without rotating housing portions from the closed position. Rather than providing a tablet position with 180 degrees of rotation without an integrated keyboard or 360 degrees of rotation to place the keyboard at the bottom of the system, a tablet configuration is provided with the housing in the closed position without any housing rotation. From an end user perspective, the tablet position is simple and intuitive to use. The transparent lid housing portion allows illumination from the display to pass through based upon a switchable film transparent or opaque state. In the tablet configuration, the end user has tablet interactions with the keyboard protected within the closed housing and out the end user's way, thus enhancing the end user's experience interacting with the system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system presents visual images in a tablet configuration through a lid housing portion closed over top of a main housing portion keyboard. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
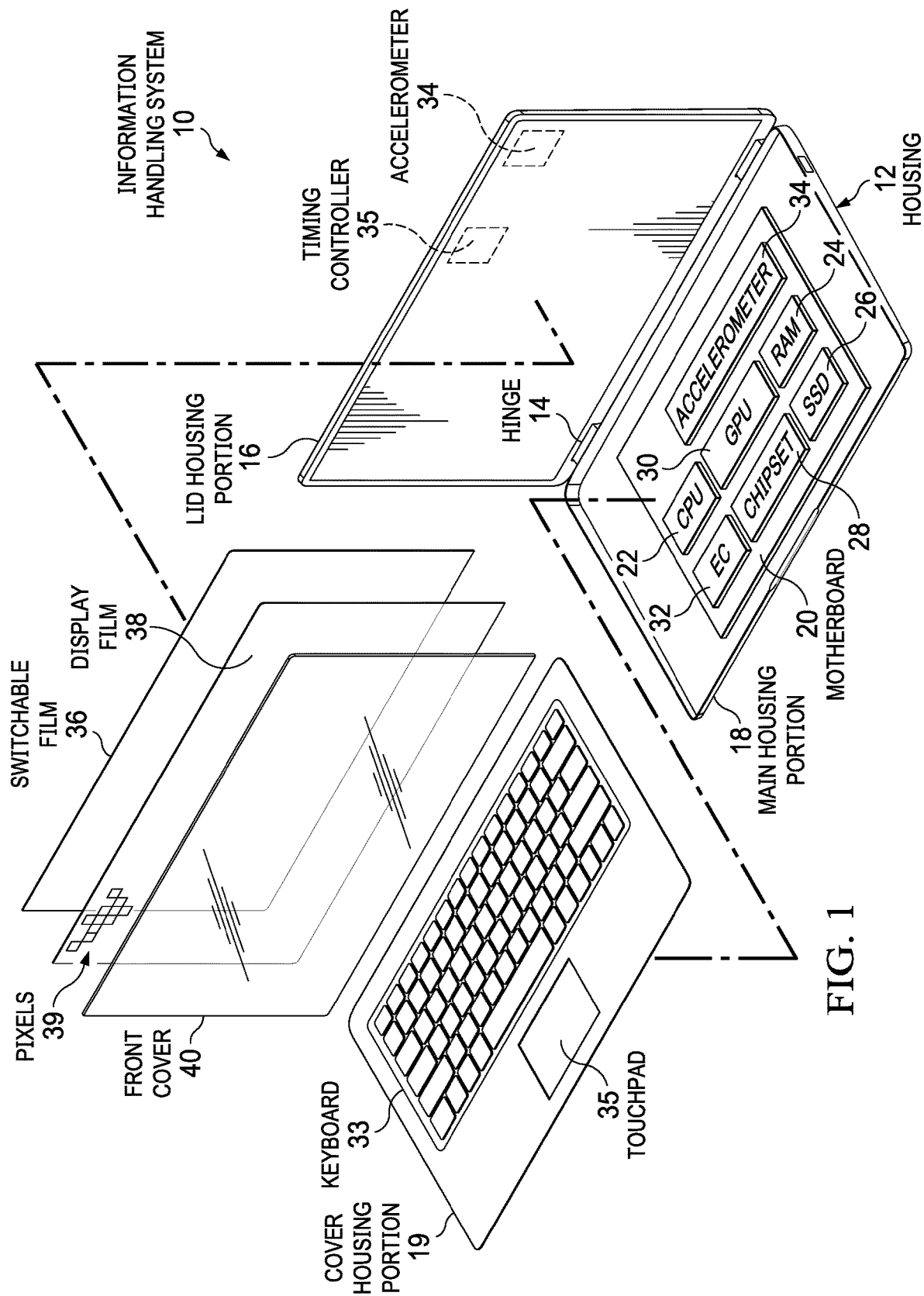
FIG. 1 depicts an exploded perspective view of a portable information handling system having a tablet configuration in a closed housing position managed by the transparent or opaque state of a switchable film.

Referring now to FIG. 1, an exploded perspective view depicts a portable information handling system 10 having a tablet configuration in a closed housing position managed by the transparent or opaque state of a switchable film 38. Portable information handling system 10 processes information with processing components disposed in a portable housing 12 having a lid housing portion 16 rotationally coupled to a main housing portion 18 by a hinge 14. In the example embodiment, main housing portion 18 couples to a motherboard 20 having wirelines that provide communication between the processing components. A central processing unit (CPU) 22 couples to motherboard 20 and executes instructions that process information with the instructions and information stored in random access memory (RAM) 24. For example, instructions of an operating system and applications are stored in persistent memory of a solid state drive (SSD) 26 and retrieved to RAM 24 at system power up. A chipset 28 interfaces with CPU 22 and provides management of CPU functions, such as clock speed, memory accesses and interactions with a graphics processor unit (GPU) 30 that generates pixel values for presentation at a display 38. An embedded controller (EC) 32 manages physical components, such as for power application to the processing components, thermal rejection by a cooling fan, and input/output device interactions. For instance, a cover housing portion 19 couples over main housing portion 18 and supports a keyboard 33 and touchpad 35 that interface with embedded controller 32 to communicate inputs to CPU 22.

A display film 38 couples to lid housing portion 16 and interfaces with GPU 30 to present information as visual images. For instance GPU 30 generates pixel values that command a color from each of plural pixels 39 disposed in columns and rows of display film 38. In the example embodiment, display film 38 is an organic light emitting diode (OLED) display film having pixels 39 of red, green and blue organic material that illuminate when a current is applied to generate red, green and blue light. A timing controller 35 receives the pixel values from GPU 30 and scans the pixel values in a defined order to pixels 39, such as from the upper left corner of display film 38 to the lower bottom right, relative to an expected end user viewing position. Display film 38 has a front cover 40 that integrates a capacitive touch sensor to detect touch inputs and has a switchable film 36 disposed between it and lid housing portion 16 that interfaces with a processing element, such as embedded controller 32 or GPU 30, to transition in response to a command between transparent and opaque states. For example, switchable film 36 is a liquid crystal display film, an OLED film, an electronic paper film, an electronic ink film or other similar material having a transparent and opaque state. Lid housing portion 16 is comprised of a transparent material so that illumination from display film 38 pixels 39 are visible at an upper and outer surface of housing 12 opposite inner lower surface proximate keyboard 33. For instance, lid housing portion 16 may be a hardened glass, composite or ceramic having a transparent quality that allows illumination from pixels 39 to pass through.

In operation, information handling system 10 selectively presents visual images at display film 38 at the inner or outer surface of lid housing portion 16 by selectively transitioning switchable film 36 between transparent and opaque states. In the open clamshell configuration depicted by FIG. 1, lid housing portion 16 rotates about hinge 14 to a raised position over main housing portion 18 to expose display film 38 at the inner surface of lid housing portion 16 for presentation of visual images through front cover 40. In the clamshell configuration, keyboard 33 and touchpad 35 are in a position to accept end user inputs while the end user is viewing display film 38. The clamshell position may be detected by sensors, such as accelerometers 34 that detect the orientation of the housing portions or a hinge sensor that detects the relative rotational orientation of the housing portions. Switchable film 36 is commanded to the opaque state in the clamshell configuration so that visual images presented at display film 38 are not visible through lid housing portion 16. When lid housing portion 16 rotates about hinge 14 to the closed position that brings front cover 40 against keyboard 33, switchable film 36 transitions to a transparent state so that visual images generated at display film 38 are visible through lid housing portion 16 and at the upper outer surface of housing 12 in a tablet configuration. In one alternative embodiment, front cover 40 may also include a switchable film that that transitions from a transparent state in the clamshell configuration to an opaque state in the tablet configuration so that the keyboard is not visible to an end user viewing visual images through lid housing portion 16 and against keyboard 33. In another alternative embodiment, the outer surface of lid housing portion 16 includes touch detection sensors, such as capacitive sensors, that detect touch inputs at the visual images in a tablet configuration. In yet another alternative embodiment, keyboard 33 and touchpad 35 may power down in the tablet configuration to help reduce power consumption. In various embodiments, the state of switchable film 36 may be managed by one or more of the processing components, such as firmware of embedded controller 32, firmware of timing controller 35, and an operating system driver executing on CPU 22.

Figure 2A:
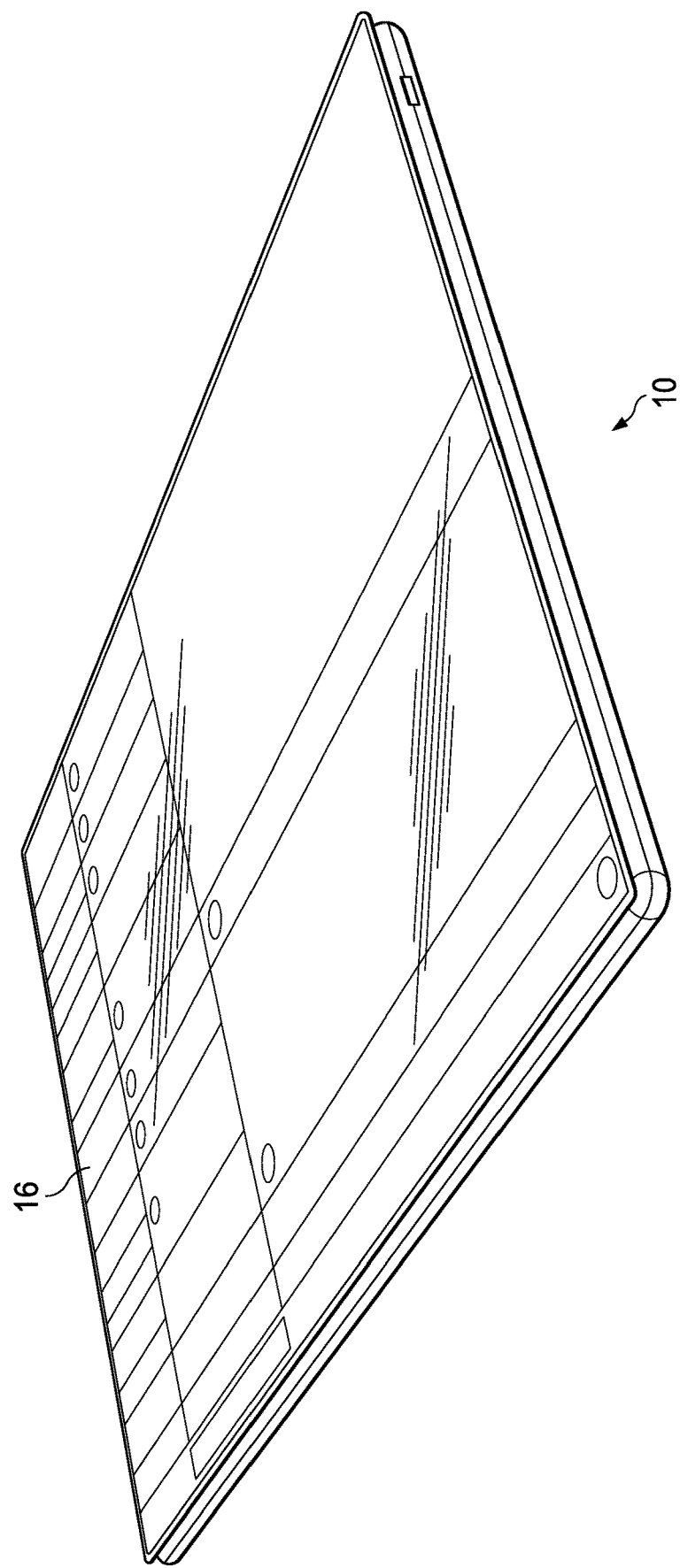
FIGS. 2A, 2B and 2C depict an example of a transition of the information handling system from the tablet to the clamshell configuration.
Figure 2B:
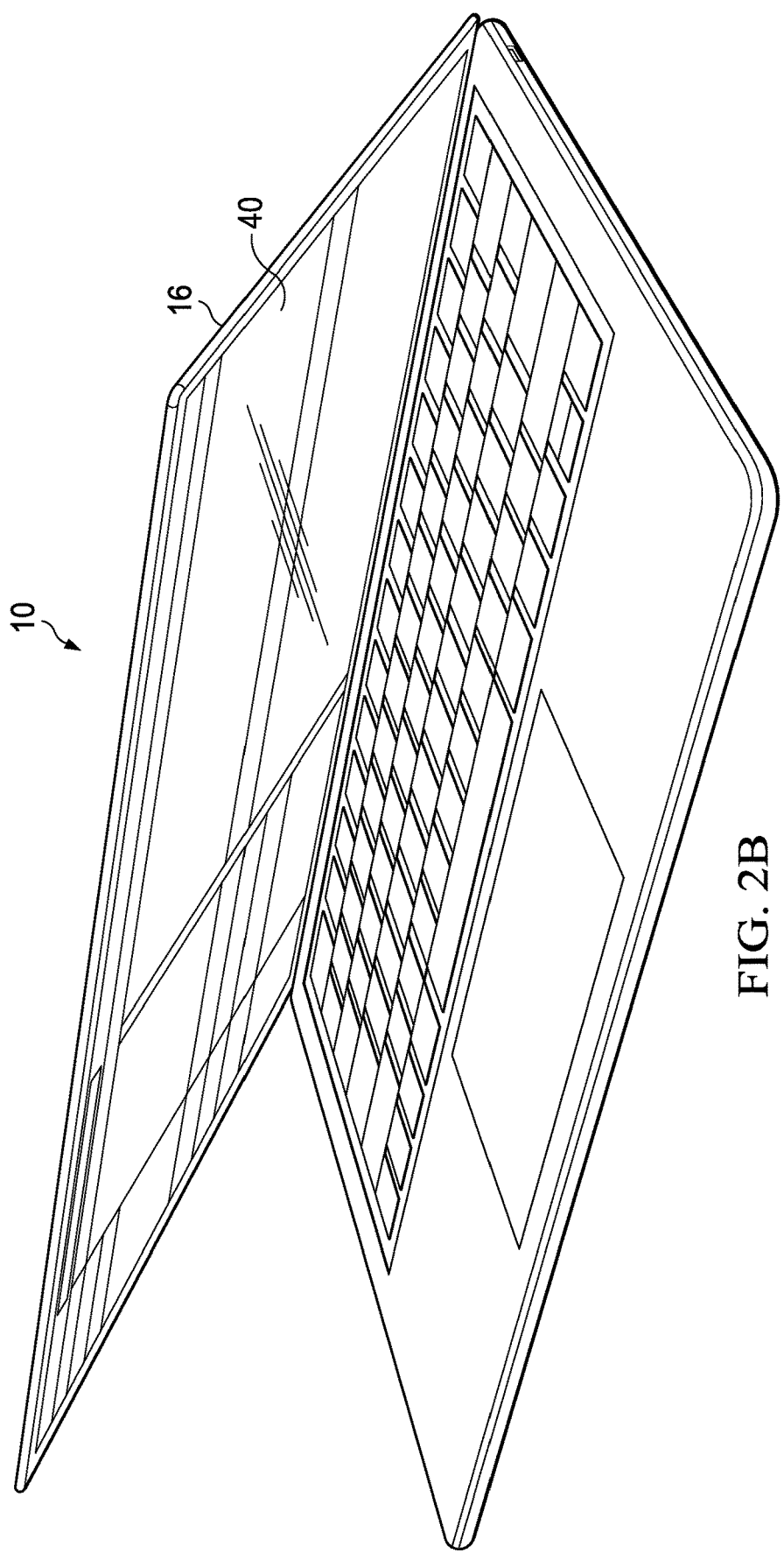
Figure 2C:
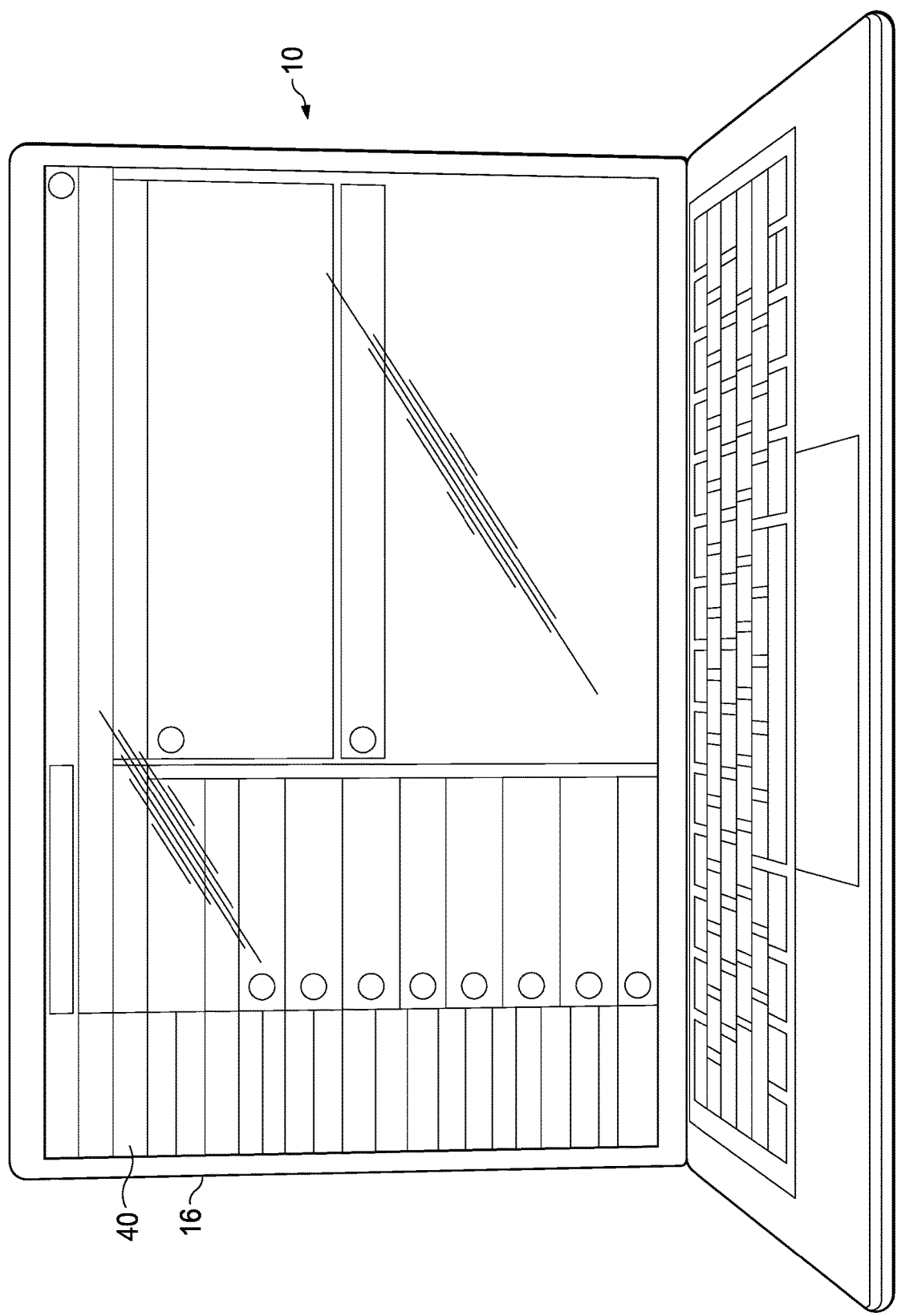

Referring now to FIGS. 2A, 2B and 2C, an example of a transition of information handling system 10 from the tablet to the clamshell configuration is depicted. FIG. 2A depicts information handling system 10 in a tablet configuration having visual images presented at the outer upper surface of lid housing portion 16. The tablet configuration may be selected, for instance, by pressing a power button with the housing in the closed position, or by closing the housing during normal operations with some indication that a tablet configuration is desired instead of a power down. In the tablet configuration, an end user interacts with the system through touches at visual images visible through lid housing portion 16 and detected by a capacitive touch sensor integrated in lid housing portion 16. FIG. 2B depicts the information handling system 10 as an end user rotates lid housing portion 16 towards an open position past a predetermined rotational orientation associated with transition to the clamshell configuration. Once the predetermined open position is reached, the switchable film behind the display film transitions to an opaque state so that visual images of the display film no longer pass through lid housing portion 16 to the outer surface. Rather, with the switchable film in the opaque state, visual images are presented through front cover 40. In one embodiment, the graphics processor outputs visual images to scan in opposite directions for the tablet and clamshell configurations, such as left to right and right to left relative to front cover 40. In an alternative embodiment, the timing controller reverses the scan of pixel values based upon the tablet or clamshell configuration. FIG. 2C depicts information handling system 10 in the clamshell configuration with visual images presented through front cover 40 and the switchable film transition to an opaque state that prevents visual images from passing out the outer surface of lid housing portion 16.

Figure 3A:
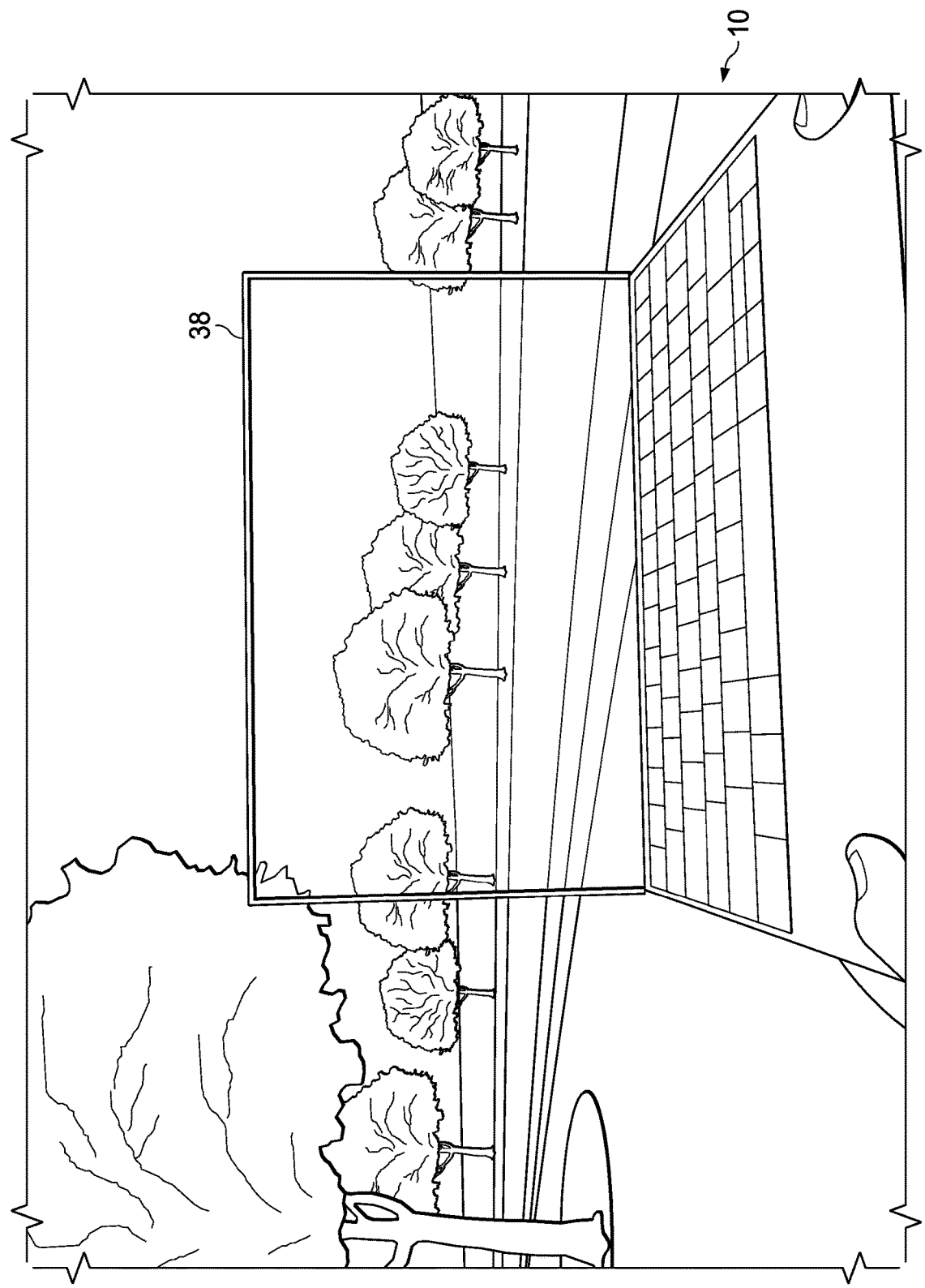
FIGS. 3A and 3B depict an example of a transition of the information handling system from a clamshell configuration to an augmented reality view by having the switchable film in a transparent state.
Figure 3B:
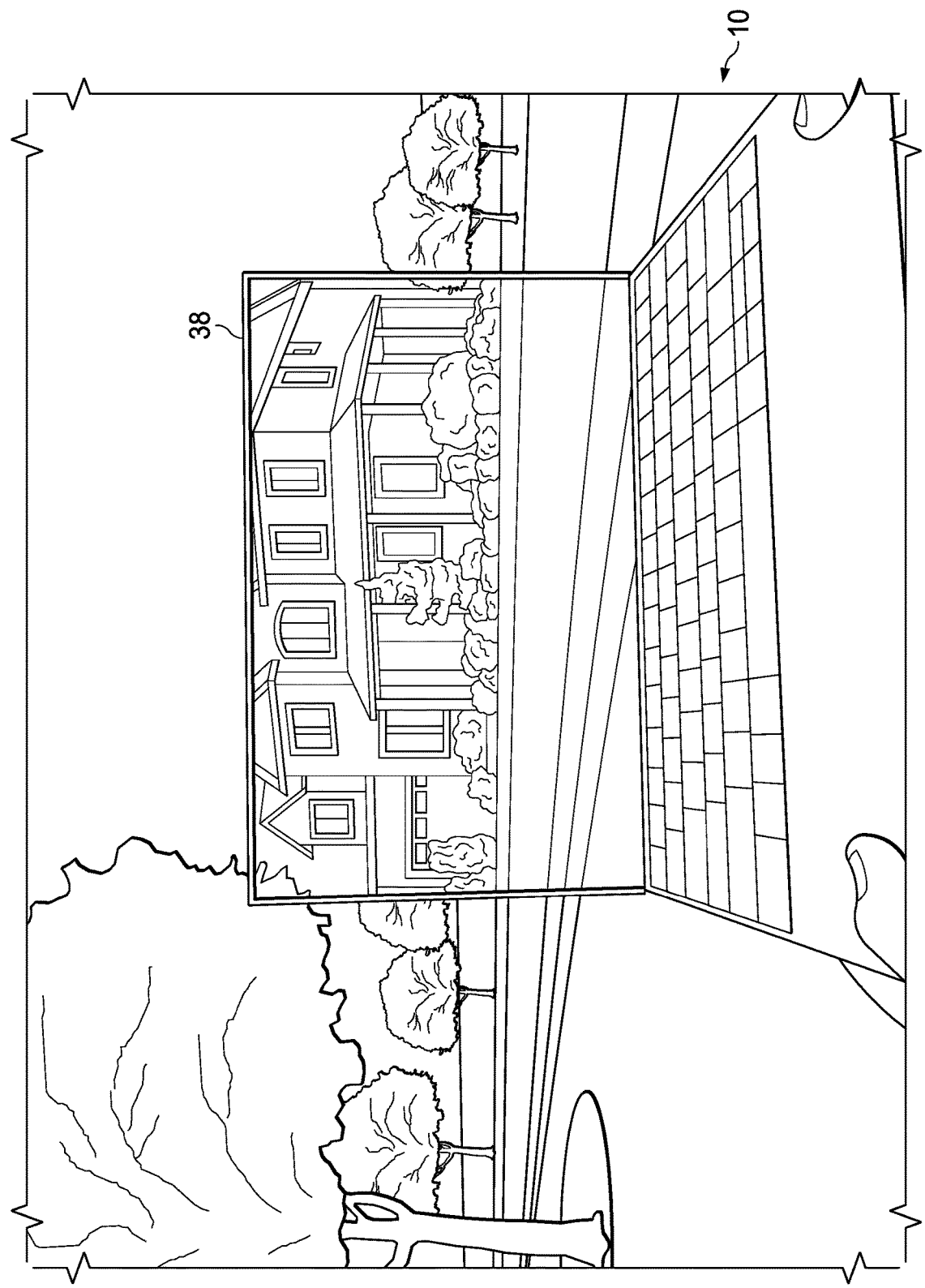

Referring now to FIGS. 3A and 3B, an example depicts a transition of the information handling system from a clamshell configuration to an augmented reality view by having the switchable film in a transparent state. FIG. 3A depicts information handling system 10 in a clamshell configuration having the switchable film in a transparent state so that a tree line behind the lid housing portion 16 is visible through the lid housing portion 16. FIG. 3B depicts a visual image of a home presented at the display film with the switchable film in a transparent state so that the home is visible in front of the tree line. In one example embodiment, the switchable film may have an opaque state behind the visual image, such as matching the shape of the home, while the remainder of the switchable film has a transparent state that allows the tree line to be visible. Alternatively, the entire switchable film may remain transparent. The augmented reality view may be selected through a user interface or based upon positioning information, such as GPS or depth camera positioning, which automatically presents the visual image in a desired relative position.

Figure 4:
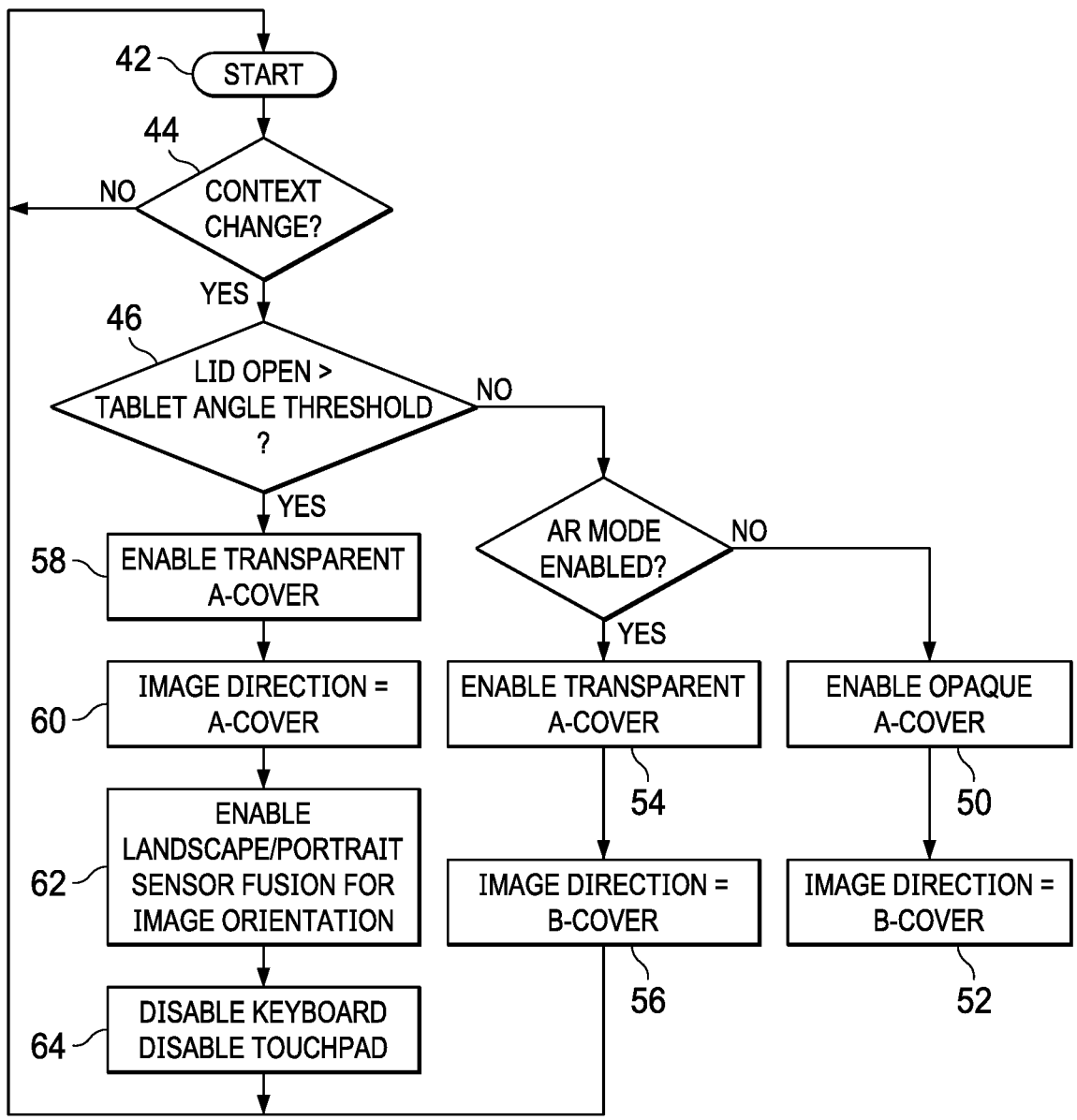
FIG. 4 depicts a flow diagram of a process for managing the transition of a switchable film to support a clamshell and tablet configuration of a portable information handling system.

Referring now to FIG. 4, a flow diagram depicts a process for managing the transition of a switchable film to support a clamshell and tablet configuration of a portable information handling system. The process starts at step 42 and continues to step 44 to determine if a context change has occurred. If not, the process returns to step 42 to continue monitoring context. Context may be determined from variety of factors, such as hinge position, hinge motion, visual images from the system, proximity sensing, touch sensing, power state changes, applications executing on the system, etc . . . . If a context change is detected, the process continues to step 46 to determine if the housing has opened greater than a tablet angle threshold. If not, the process continues to step 48 to determine if the augmented reality mode is enabled. If the lid is open greater than the threshold and the augmented reality mode is not enabled, the process continues to step 50 enable the opaque state of the switching film and to step 52 to enable presentation of the visual images oriented for viewing from the inner surface of the lid housing portion. If at step 48 the augmented reality mode is enabled, the process continues to step 54 to enable the transparent state of the switchable film in the lid housing portion. At step 56, presentation of the visual images are oriented for viewing from the inner surface of the lid housing portion against a background of light that passes through the lid housing portion from the upper side of the lid housing portion. The process then returns to step 42 to continue monitoring the context at the information handling system.

At step 46 if the housing rotational orientation is less than a tablet threshold, the process continues to step 58 to enable the switchable film to a transparent state that allows visual images to proceed from the display film and out the outer upper surface of the lid housing portion. At step 60, visual images generated by the display film are oriented for viewing at the outer surface of the lid housing portion in the tablet configuration. In an alternative embodiment where a front cover the display film has a switchable film, that inner switchable film may be switched to an opaque state so that the keyboard is not visible through the lid housing portion in the background of the visual image. At step 62, landscape and portrait sensor fusion is enabled for visual image orientation in the tablet mode. At step 64, the keyboard and touchpad are disabled to reduce system power consumption and the process returns to step 42 to continue monitoring system context.

Although the present invention has been described in detail, it should be understood that various changes, substitutions and alterations can be made hereto without departing from the spirit and scope of the invention as defined by the appended claims.

What is claimed is:

1. An information handling system comprising:
   a housing having first and second housing portions rotationally coupled to rotate between a closed position and a clamshell position, the second housing portion having a transparent material;
   processing components disposed in the housing and operable to process information;
   a keyboard disposed in the first housing portion and interfaced with the processing components to accept keyed inputs;
   a display disposed in the second housing portion and interfaced with the processing components to present the information as visual images;
   a switchable film disposed in the second housing aligned with the display and interfaced with the processing components; and
   a non-transitory memory storing instructions that when executed on the processing components cause the switchable film to transition between a transparent state to present images with the display in a first orientation through the transparent housing at a rear side of the transparent housing and an opaque state to present images with the display in a second orientation opposite the first orientation at a front side of the transparent housing based upon one or more predetermined conditions including at least a rotational orientation of the first and second housing portions;
   wherein the instructions orient the visual images for presentation at an inner surface of the second housing portion when the switchable film has the opaque state and orient the visual images for presentation at an outer surface of the second housing portion when the switchable film has the transparent state.

2. The information handling system of claim 1 further comprising:
   a sensor disposed in the housing and interfaced with the processing components, the sensor operable to detect the rotational orientation;
   wherein the instructions command a transition of the switchable film from the transparent state to the opaque state as the rotational orientation adjusts from the closed position towards the clamshell position.

3. The information handling system of claim 2 further comprising a touch detection sensor integrated in an outer surface of the second housing portion, the display presenting visual images at the outer surface in the closed position and accepting touch inputs at the visual images with the touch detection sensor.

4. The information handling system of claim 3 wherein the switchable film comprises an OLED film.

5. The information handling system of claim 3 wherein the switchable film comprises an LCD film.

6. The information handling system of claim 3 wherein the switchable film comprises electronic-paper.

7. The information handling system of claim 3 wherein the instructions command power off of keyboard scanning when the display presents visual images at the outer surface in the closed position.

8. The information handling system of claim 2 wherein the instructions have an override that selectively commands the switchable film to the transparent state with the housing in the clamshell orientation to present visual images with augmented reality.

9. A method for presenting visual images at an information handling system, the method comprising:
   monitoring context at the information handling system to determine when the information handling system is rotated to a tablet position and a clamshell position;
   when in the clamshell position, presenting visual images with a display film at an inner surface of the housing with a switchable film configured to an opaque state, the visual images having a first orientation for viewing at the inner surface; and
   when in the tablet position, presenting the visual images with the display film at an outer surface of the housing with the switchable film configured to a transparent state, the visual images having a second orientation for viewing at the outer surface.

10. The method of claim 9 further comprising:
    closing a housing of the information handling system to bring the display at the inner surface in proximity against a keyboard integrated in the housing; and
    presenting the visual images out the upper side of the outer surface as the tablet position.

11. The method of claim 10 further comprising:
    integrating a touch detection sensor in the outer surface; and
    accepting touch inputs at the visual images with the touch detection sensor in the tablet position.

12. The method of claim 11 further comprising:
    rotating the housing from the tablet position towards the clamshell;
    detecting a predetermined rotational orientation;
    in response to the predetermined rotational orientation, configuring the switchable film from the transparent to the opaque state; and
    in response to the predetermined rotational orientation, reversing the visual image orientation for presentation at the inner surface of the housing.

13. The method of claim 12 further comprising:
    powering down a keyboard in the tablet position; and
    in response to the predetermined rotational orientation, powering up the keyboard.

14. The method of claim 9 further comprising:
    determining context of the clamshell position and augmented reality visual images; and
    in response to the determining context, configuring the switchable film from the opaque state to the transparent state.

15. A display comprising:
    a transparent housing;
    a display film disposed in the transparent housing and operable to present information as visual images;
    a switchable film disposed between display film and the transparent housing, the switchable film having a transparent state and an opaque state;
    a sensor operable to detect a tablet configuration and a clamshell configuration of the transparent housing; and
    a controller interfaced with the switchable film and the sensor to command the opaque state in the clamshell configuration to present visual images with the display film at a front side of the display film, the visual images having a first orientation, and to command the transparent state in the tablet configuration to present visual images with the display film through the transparent housing, the visual images having a second orientation opposite the first orientation.

16. The display of claim 15 further comprising:
    a graphics processor operable to generate pixel values that define the visual image;

wherein:
in the clamshell configuration, the graphics processor generates the pixel values to present the visual image for viewing at the display opposite the switchable film; and
in the tablet configuration, the graphics processor generates the pixel values to present the visual image for viewing through the switchable film.

17. The display of claim 15 further comprising:
a timing controller operable to generate the visual images with pixel values provided from a graphics processor and scanned to the display film pixels;
wherein:
in the clamshell configuration, the timing controller scans the pixel values to present the visual image for viewing at the display opposite the switchable film; and
in the tablet configuration, the timing controller scans the pixel values to present the visual image for viewing through the switchable film.

18. The display of 15 wherein the sensor detects movement of the housing between the tablet configuration and the clamshell configuration and the controller transitions between the transparent and opaque states at a predetermined movement.

19. The display of claim 15 wherein the tablet configuration comprises the transparent housing closed over a main housing having keyboard and presenting the visual images at the upper surface of the transparent housing.

\* \* \* \* \*